United States Patent [19]
Jonaidi

[11] Patent Number: 6,091,155
[45] Date of Patent: Jul. 18, 2000

[54] BGA LAND PATTERN

[75] Inventor: Siamak Jonaidi, San Jose, Calif.

[73] Assignee: Silicon Graphics, Inc., Mountain View, Calif.

[21] Appl. No.: 08/606,291

[22] Filed: Feb. 23, 1996

[51] Int. Cl.[7] .......................... H01L 23/48; H01L 23/52; H01L 29/40

[52] U.S. Cl. .................. 257/786; 257/738; 257/773; 257/774; 361/760; 361/772

[58] Field of Search ..................... 257/738, 774, 257/786, 773; 361/777, 760

[56] References Cited

U.S. PATENT DOCUMENTS 4,878,098  10/1989  Saito et al. ......................... 257/786
5,264,729  11/1993  Rostoker et al. ......................... 257/774

*Primary Examiner*—Teresa M. Arroyo
*Attorney, Agent, or Firm*—Wagner, Murabito & Hao LLP

[57] ABSTRACT

A ball grid array (BGA) land pattern. In the present invention, a capture pad is disposed on a substrate. The capture pad is electrically coupled to a via which is formed into the substrate. A substantially rectangularly-shaped landing pad is also disposed on the substrate proximate to the capture pad. The substantially rectangularly-shaped landing pad is electrically coupled to the capture pad. In one embodiment, an electrically conductive connecting region electrically connects the substantially rectangularly-shaped landing pad to the capture pad. More specifically, the electrically conductive connecting region has a first end coupled to the capture pad and a second end coupled to the substantially rectangularly-shaped landing pad.

15 Claims, 11 Drawing Sheets

BGA LAND PATTERN

TECHNICAL FIELD

This invention relates to interconnect configurations. Specifically, the present invention relates to ball grid array (BGA) interconnects.

BACKGROUND ART

Electrical and mechanical interconnects are essential in many computer and electrical components. Interconnects allow electrical signals such as, for example, address signals, data signals, control signals, and power and ground, to be passed from one location to another location. For example, an interconnect allows a packaged integrated circuit to receive or output electrical signals to or from an underlying printed circuit board. As is well known in the art, a packaged integrated circuit typically consists of an integrated circuit die encapsulated in a protective material such as ceramic or plastic. The packaged integrated circuit usually includes some type of electrical connector which extends from the integrated circuit to the outside of the package.

One frequently used type of prior art interconnect is a ball grid array (BGA) interconnect. In a prior art BGA interconnect, an electrically conductive sphere or ball or, more commonly, a plurality of electrically conductive balls are used to transfer signals from one location to another location. As an example, a BGA interconnect is often used to input or output electrical signals from a packaged integrated circuit to an underlying printed circuit board. In such an embodiment, a plurality of conductive balls are positioned in an array on a surface such as, for example, the bottom surface of the packaged integrated circuit. The electrically conductive balls are electrically and mechanically coupled to various input and output pads of the packaged integrated circuit. In a prior art configuration where a packaged integrated circuit is to be electrically coupled to a printed circuit board, a plurality of electrically conductive "land patterns" are arranged in a array on the top surface of the printed circuit board. The array of the electrically conductive land patterns mirrors the array of conductive balls. That is, for every conductive ball, there is a corresponding landing pattern. The electrically conductive land patterns include a conductive region referred to as a landing pad. Each landing pad is electrically connected to a capture pad. The capture pad is electrically coupled to a via which is formed into the printed circuit board. Thus, each conductive ball contacts or "lands on" a respective circular electrically conductive landing pad when the packaged integrated circuit is selectively aligned with and placed onto the printed circuit board. As a result, a signal can be passed from the integrated circuit, through a package interconnect, through a conductive ball, through a landing pad, to a capture pad, to a via, and into the underlying printed circuit board circuitry. Hence, input and output pads of the packaged integrated circuit are electrically coupled to vias in the printed circuit board.

Prior Art FIG. 1A shows a portion of printed circuit board 10 with a conventional BGA interconnect land pattern 12 disposed thereon. The conventional BGA interconnect land pattern shape is commonly referred to as "dogbone" land pattern. Prior art dogbone BGA land pattern 12 includes a capture pad 14 which is coupled to via 16 which is formed into printed circuit board 10. Dogbone BGA land pattern 12 also includes a circular landing pad 18. Circular landing pad 18 and capture pad 14 are electrically coupled by a connecting region 20. Prior Art FIG. 1B shows typical arrangement of land patterns, wherein a plurality of conventional BGA interconnect land patterns are disposed in an array.

Although dogbone BGA interconnect land patterns are well known in the art, such prior art land patterns have substantial limitations and disadvantages. For instance, as the number of vias per unit area, i.e. package density, in the printed circuit board increases, the pitch or size of prior art BGA land patterns have been correspondingly reduced. The reduced size of the prior art BGA land patterns results in several problems. For example, the small capture pads found in prior art BGA land patterns necessitate more precise drilling of vias, thereby requiring higher manufacturing accuracy. The small capture pads further require a small opening for an overlying solder mask. With such small capture pads and solder mask openings, even a slight misalignment between the solder mask and the capture pads can cause defects. Specifically, a solder mask misalignment will result in solder mask being deposited into or near the via instead of having the solder mask reside only on the periphery of the capture pad. As a result, the solder mask does not appropriately and uniformly coat the capture pad. If the via is coated with solder mask, the via will not be covered with solder. The uncoated via is then susceptible to corrosion and the like and can cause defects or shorts.

Additionally, as the density of vias in the printed circuit board increases, the distance between the landing pad and the via in prior art BGA land patterns has become extremely short. As a result, prior art BGA land patterns have limited thermal impedance between the landing pad and the via. Furthermore, it is well known that a via in a printed circuit board acts as a heat sink. Therefore, in prior art BGA land patterns, significant heat escapes or is transferred from the landing pad to the via. The heat which escapes or is transferred into the via increases the time which is required to melt solder present on the landing pad. That is, heat which is intended to melt solder on the landing pad is instead thermally transferred across the short conducting region and into the via. As a result, solder on prior art BGA landing pads can remain unmelted after convective heating process steps. The unmelted solder results in opens and/or shorts thereby leaving input and output pads of the packaged integrated circuit unconnected to the printed circuit board.

Another problem with prior art BGA land patterns is "pad lifting." Pad lifting occurs when the landing pad and/or the capture pad lifts or peels from the underlying substrate. Pad lifting may occur, for example, during replacement of a packaged integrated circuit when conductive balls are separated from respective landing pads. Pad lifting may also occur during cleaning and scrubbing of the landing pad and/or the capture pad. The problem of pad lifting is especially prevalent with small sized BGA land patterns. As prior art BGA land patterns decrease in size, less land pattern area is available to adhere to the underlying substrate. Thus, pad lifting becomes a more frequent and troublesome occurrence in smaller prior art BGA land patterns.

The creation of loose solder balls is yet another disadvantage associated with prior art BGA land patterns. A certain amount of solder is required to connect each landing pad to a respective conductive ball. Furthermore, solder paste is commonly applied in a uniform specified thickness to selected regions on, for example, the top surface of the substrate. The solder paste is commonly applied through selective aperture openings to an area or region slightly larger than the solder wettable area to which the molten solder will be confined. As the solder paste is heated, the molten solder will wick back or diffuse to the solder wettable area such as, for example, the landing pad of a prior art BGA land pattern. The wicking or diffusion of the molten solder to the solder wettable area is referred to as "pullback." As the size of prior art BGA landing pads decreases, a greater pullback is required to obtain the necessary amount of solder on the landing pad. That is, because the solder paste is applied in a uniform thickness, the area over which the solder paste is applied must extend over a much larger area than the reduced solder wettable landing pad area to which the molten solder will ultimately be confined. Thus, small prior art BGA land patterns induce significant solder pullback. As the amount of pullback increases, the chance that some portion of the solder will not pullback to the solder wettable area also increases. Portions of the solder which do not pullback to the solder wettable area can generate loose solder balls. The loose solder balls are processing defects that can cause malfunctions in the electrical environment through random shorts.

With reference still to prior art FIG. 1, wide connecting region 20 between has solder mask disposed thereon. The solder mask dam prevents solder from diffusing or wicking between landing pad 18 and capture pad 14. The size or width of connecting region 20 is yet another disadvantage of the prior art BGA land patterns. Specifically, wide connecting region 20 is susceptible to chipping or flaking. Chipping or flaking of the solder mask dam allows solder to diffuse or wick between the landing pad and the capture pad. The solder then escapes from the landing pad to the capture pad resulting in opens.

X-ray inspection of solder connections is also difficult in prior art BGA land patterns. Once a conductive ball is soldered to landing pad 18, solder extends from circular landing pad 18 to the conductive ball. An x-ray image does not clearly show the integrity or shape of the solder connection. Instead, the x-ray tends to show the circular shape of landing pad 18. Thus, in prior art BGA land patterns, x-ray inspection does not provide much insight into the integrity of solder joints.

Thus, a need exists for a BGA land pattern which reduces or eliminates defects associated with prior art BGA land patterns; a BGA land pattern which can accommodate fine pitch applications; and a BGA land pattern which does not deleteriously reduce the size of landing pads or capture pads.

DISCLOSURE OF THE INVENTION

The present invention provides a BGA land pattern which reduces or eliminates defects associated with prior art BGA land patterns; a BGA land pattern which can accommodate fine pitch applications; and a BGA land pattern which does not deleteriously reduce the size of landing pads or capture pads. The above is provided by a ball grid array (BGA) land pattern having a capture pad electrically coupled to a substantially rectangularly-shaped landing pad.

In one embodiment, a ball grid array (BGA) land pattern is disclosed. In the present invention, a capture pad is disposed on a substrate. The capture pad is electrically coupled to a via which is formed into the substrate. A substantially rectangularly-shaped landing pad is also disposed on the substrate proximate to the capture pad. The substantially rectangularly-shaped landing pad is electrically coupled to the capture pad. In one embodiment, an electrically conductive connecting region electrically connects the substantially rectangularly-shaped landing pad to the capture pad. More specifically, the electrically conductive connecting region has a first end coupled to the capture pad and a second end coupled to the substantially rectangularly-shaped landing pad.

In another embodiment, all the features of the above embodiment are present and the substantially rectangularly-shaped landing pad is specifically oriented with respect to the capture pad. More precisely, the substantially rectangularly-shaped landing pad is oriented with respect to the capture pad such that the center of the substantially rectangularly-shaped landing pad, a corner of the substantially rectangularly-shaped landing pad, and the center of the via are not collinear.

In yet another embodiment, the substantially rectangularly-shaped landing pad is again oriented with respect to the capture pad such that the center of the substantially rectangularly-shaped landing pad, a corner of the substantially rectangularly-shaped landing pad, and the center of the via are not collinear. In addition, the electrically conductive connecting region extends from the capture pad to a nearest corner of the substantially rectangularly-shaped landing pad.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 2:
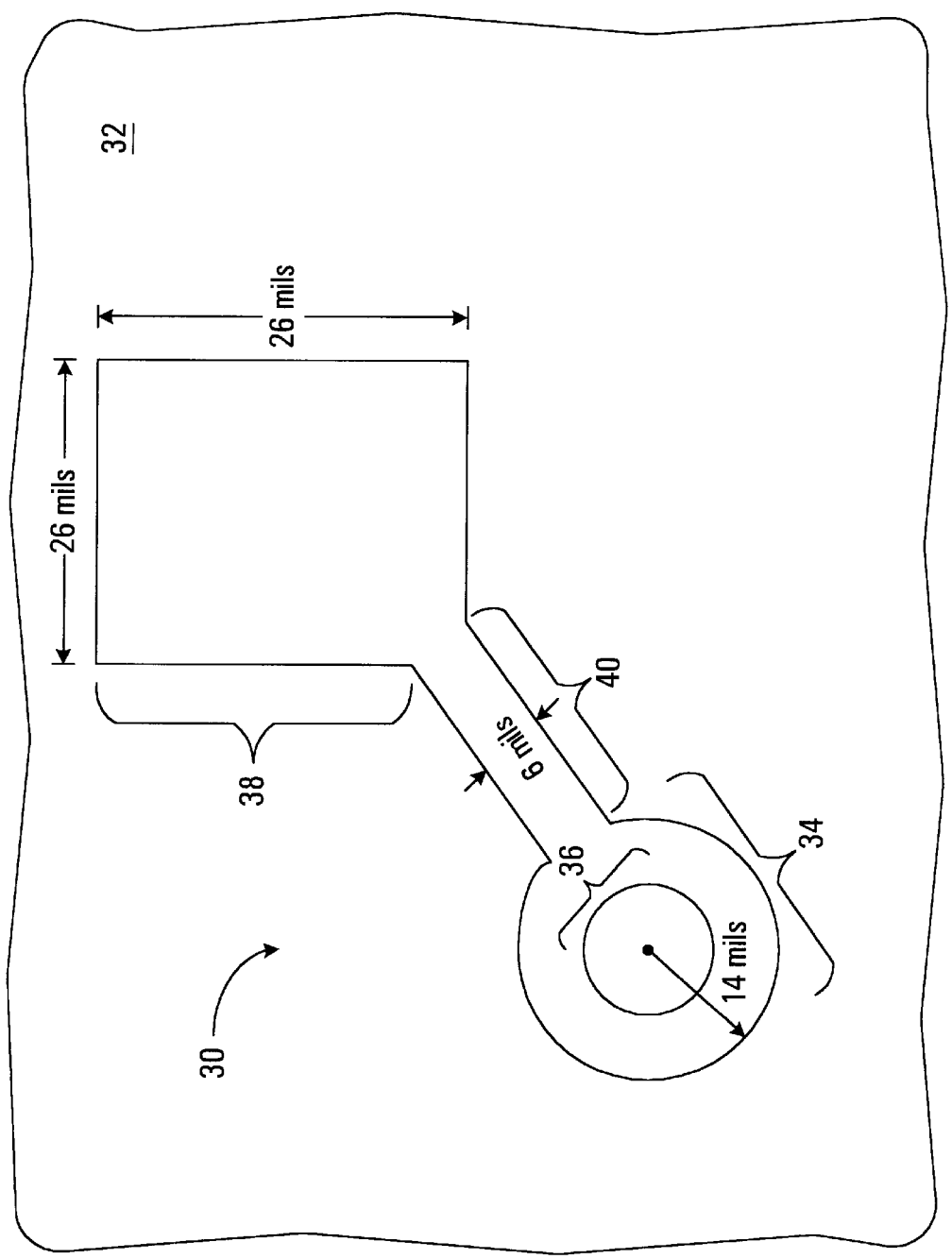
FIG. 2 is a schematic diagram of one embodiment of a BGA land pattern having a substantially rectangularly-shaped landing pad in accordance with the present claimed invention.

With reference now to FIG. 2, a schematic diagram of one embodiment of a BGA land pattern 30 of the present invention disposed on a printed circuit board 32 is shown. Although the present BGA land pattern 30 is disposed on a printed circuit board 32 in FIG. 2, such a depiction is merely illustrative. It will be understood that the present invention is also well suited to being disposed on numerous other types of substrates. Futhermore, the present invention is also well suited to having BGA land pattern 30 disposed on multiple surfaces of a substrate such as, for example, both ends of a via. In the present invention, BGA land pattern 30 is comprised of an annularly-shaped capture pad 34 which peripherally surrounds and is electrically coupled to a via 36. Via 36 is formed into printed circuit board 32. BGA land pattern 30 also includes a substantially rectangularly-shaped landing pad 38. Substantially rectangularly-shaped landing pad 38 and annularly-shaped capture pad 34 are electrically coupled by a conductive connecting region 40.

Figure 1A:
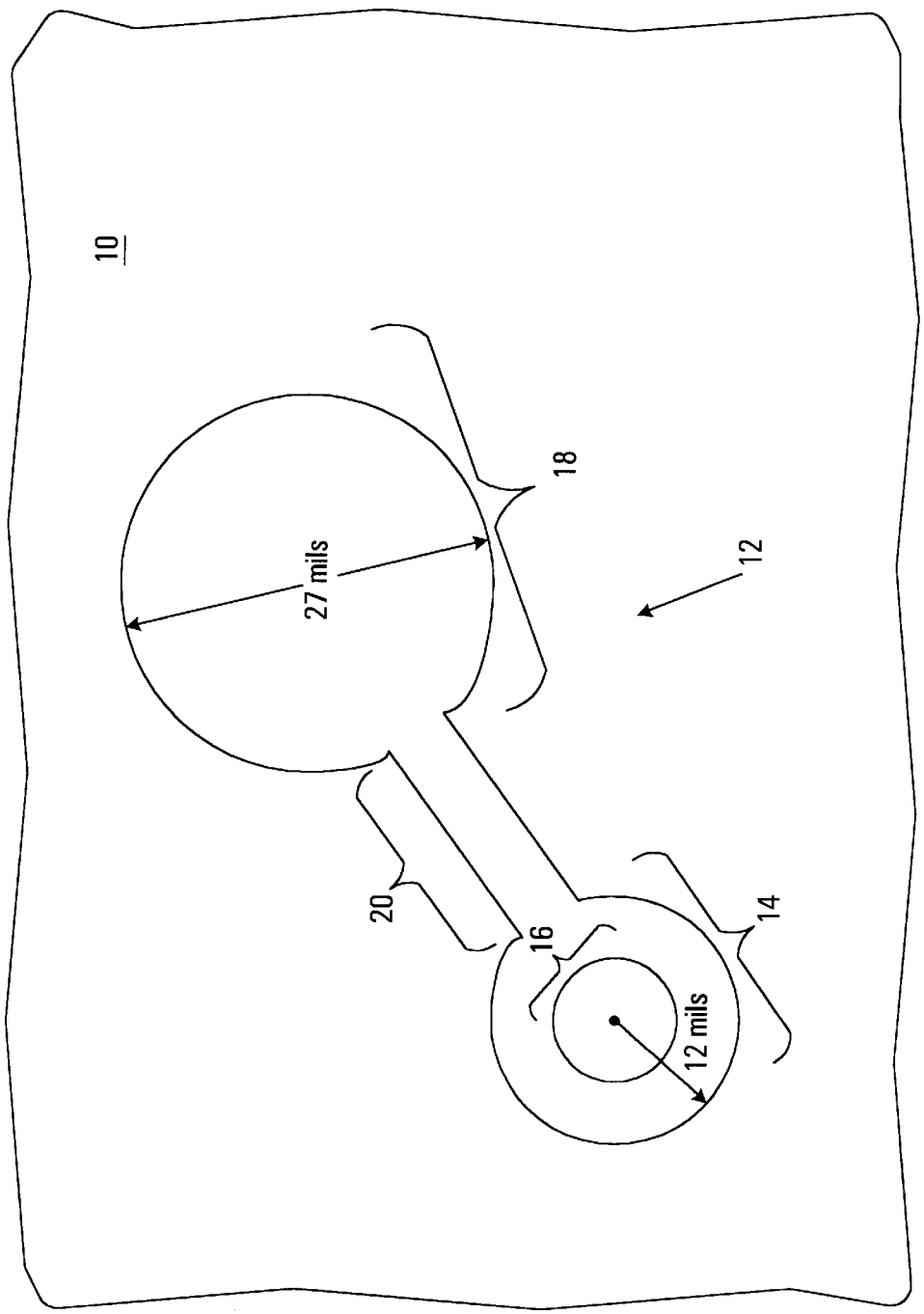
FIG. 1A is a schematic view of a Prior Art dogbone BGA interconnect land pattern.
Figure 1B:
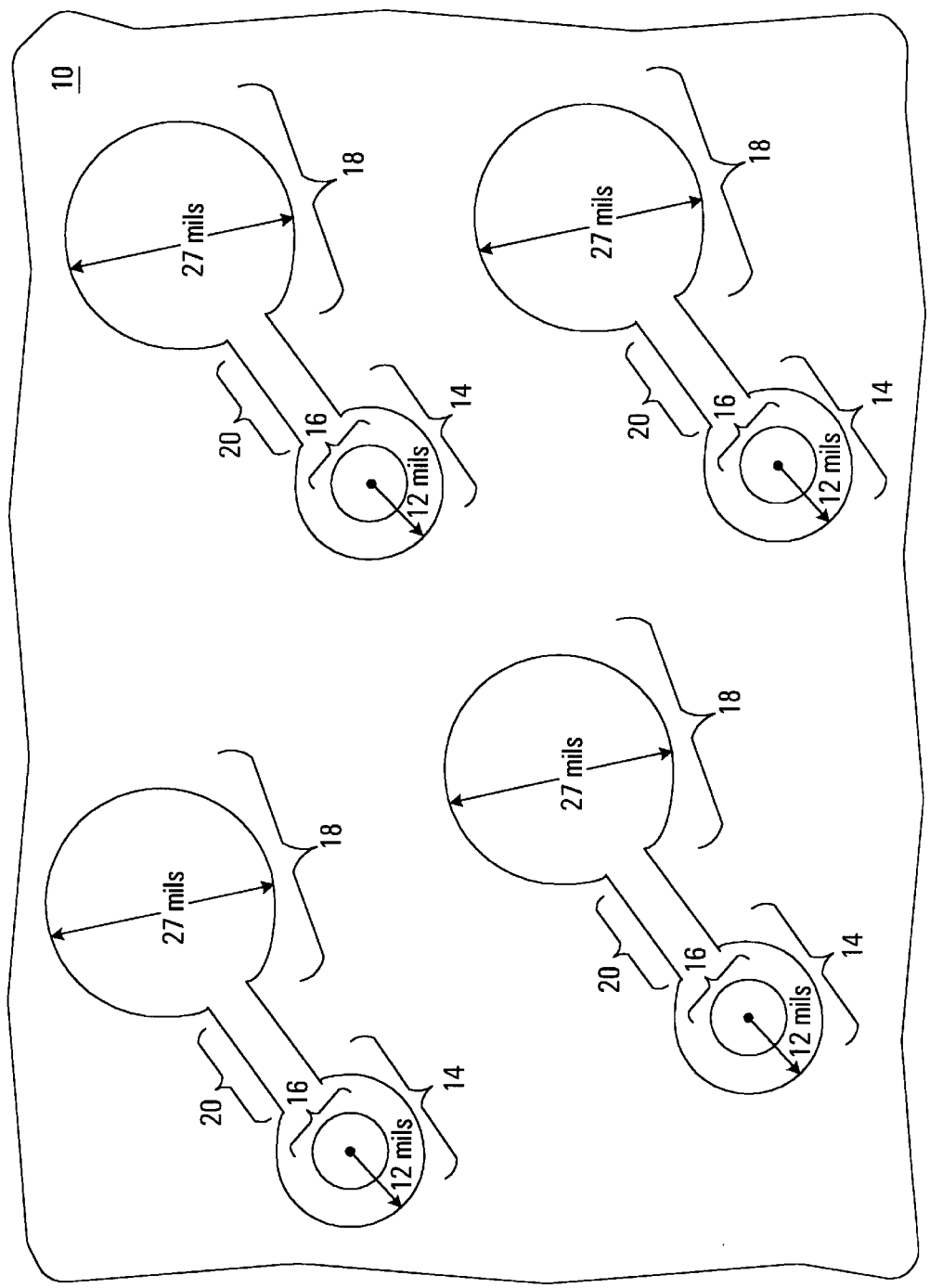
FIG. 1B is a schematic view of a plurality of Prior Art dogbone BGA interconnect land patterns disposed in an array.

With reference still to FIG. 1, the dimensions of each portion of BGA land pattern 30 are also given. As shown in FIG. 1, the dimensions of present BGA land pattern 30 are very different from the dimensions of prior art BGA land pattern 12 of prior art FIG. 1. In the present invention, each side of substantially rectangularly-shaped landing pad 38 is approximately 26 mils long. With reference still to FIG. 1, annularly-shaped capture pad 34 has an outer diameter which extends approximately 14 mils from the center of via 36. Conductive connecting region 40, coupling substantially rectangularly-shaped landing pad 38 and annularly-shaped capture pad 34, has a width of approximately 6 mils. Although such dimensions are used in the present embodiment, the present invention is also well suited to varying the dimensions of the components of BGA land pattern 30.

It can be determined from the above dimensions, that substantially rectangularly-shaped landing pad 38 has an area of approximately 676 square mils. On the other hand, prior art circular BGA landing pad 12 of prior art FIG. 1 has an area of approximately 573 square mils. Thus, the present invention provides a BGA land pattern with landing pad having an area greater than the area found in prior art BGA land patterns.

With reference still to FIG. 1, annularly-shaped capture pad has an outer diameter which extends approximately 14 mils from the center of via 36. Thus, annularly-shaped capture pad 34 of the present invention has an outer diameter which extends several mils farther from the center of a via than does capture pad 14 of prior art FIG. 1. Thus, the area of annularly-shaped capture pad 34 is greater than the area of prior art capture pads. Although present BGA land pattern 30 provides greater landing pad and capture pad area, the present invention can be under the same density conditions as prior art BGA land patterns. That is, present BGA land pattern 30 makes a more efficient use of substrate space. Therefore, greater capture pad and landing pad area are achieved without limiting the present invention to low pitch applications. Thus, the present invention can be used instead of prior art BGA land patterns and the present invention will provide greater capture pad and landing pad area.

The enlarged capture pad and landing pad area of present BGA land pattern 30 eliminates several problems associated with the prior art. For example, the larger capture pad of present BGA land pattern 30 eliminates the need for precise drilling of vias, and a small opening in an overlying solder mask. By providing for larger solder mask openings, slight misalignments between the solder mask and capture pad 34 will not result in a deleterious defect. Thus, a slight solder mask misalignment will no longer result in solder mask being deposited into or near via 36 instead of having solder mask reside only on capture pad 36. As a result, the present invention reduces the chance that a via will be uncoated by solder, and thereby reduces the occurrence of defects due to corrosion of uncoated vias.

With reference still to FIG. 2, the present invention also reduces the occurrence of pad lifting. The increased capture pad and landing pad area achieved by the present invention provides greater adhesion between capture pad 34 and underlying substrate 32, and landing pad 38 and underlying substrate 32. Specifically, capture pad 34 of the present invention provides 35 percent greater adhesion than prior art BGA capture pads. Likewise, landing pad 38 provides a 27 percent improvement in adhesion over prior art BGA landing pads. Thus, during replacement of a packaged integrated circuit or cleaning of the landing pad and/or the capture pad, the frequency of pad lifting is reduced by the present invention.

With reference yet again to FIG. 2, the present invention also reduces the formation of loose solder balls. As stated above, as the size of prior art BGA landing pads decreases, a greater pullback is required to obtain the necessary amount of solder on the landing pad. However, in the present invention, the increased area of landing pad 38 reduces the size of the peripheral area over which solder paste is applied. That is, in the present invention, the solder paste does not extend as far beyond the landing pad as it does in the prior art. In fact, the increased area of landing pad 38 reduces pullback by approximately 10 percent over prior art BGA land patterns. Thus, the present invention decreases the amount of pullback, thereby reducing the chance that some portion of the solder will not pullback to the solder wettable landing pad 38. As a result, the present invention decreases the chance that loose solder balls will contaminate the electrical environment and cause shorts or other processing defects.

As shown in FIG. 2, conductive connecting region 40 has a width of approximately 6 mils. Thus, conductive connecting region 40 has a width approximately one-half the width found in prior art BGA land patterns. As stated above, conductive connecting region 40 is coated with a solder mask dam. The narrower width of conductive connecting region 40 provides a 50 percent smaller solder mask dam frontal area. The narrower conductive connecting region 40 and smaller frontal area of the present invention is less susceptible to chipping or flaking of the solder mask coating. Therefore, the present invention reduces the occurrence of opens resulting from chipping or flaking of the solder mask dam covering conductive connecting region 40.

Figure 3:
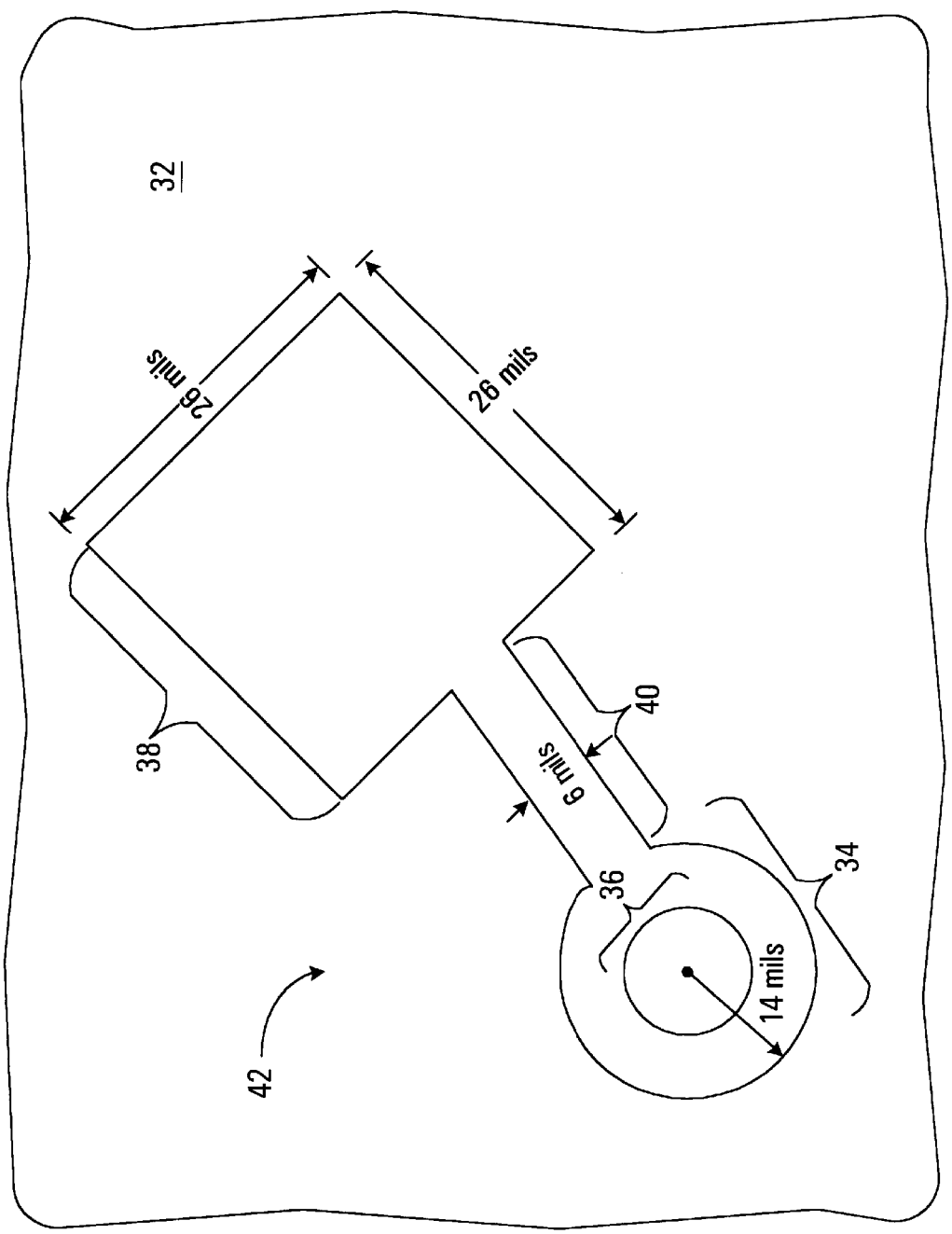
FIG. 3 is a schematic diagram of a diamond-shaped BGA land pattern having a substantially rectangularly-shaped landing specifically oriented with respect to a capture pad in accordance with the present claimed invention.

With reference now to FIG. 3, a schematic diagram of a diamond-shaped embodiment of a BGA land pattern 42 of the present invention is shown. The dimensions of the diamond-shaped embodiment of the present invention are also given. Although such dimensions are used in the present embodiment, the present invention is also well suited to varying the dimensions of the components of BGA land pattern 42. In the present embodiment, substantially rectangularly-shaped landing pad 38 is oriented with respect to capture pad 34 such that the center of substantially rectangularly-shaped landing pad 38, a corner of substantially rectangularly-shaped landing pad 38, and the center of via 36 are not collinear. In diamond-shaped BGA land pattern 42, one end of conductive connecting region 40 is coupled to capture pad 34 while the other end of conductive connecting region 40 is coupled to an edge of substantially rectangularly-shaped landing pad 38. In addition to providing all of the advantages associated with the embodiment of FIG. 2, the present embodiment achieves an even more efficient use of substrate space. That is, the present embodiment, provides even greater separation between adjacent land patterns. Diamond-shaped embodiment 42 is also well suited to varying the degree to which substantially rectangularly-shaped landing pad 38 is rotated with respect to capture pad 34. That is, the present embodiment is well suited to having the orientation of substantially rectangularly-shaped landing pad 38 shifted either clockwise or counterclockwise as long as the center of substantially rectangularly-shaped landing pad 38, a corner of substantially rectangularly-shaped landing pad 38, and the center of via 36 are not collinear.

Figure 4:
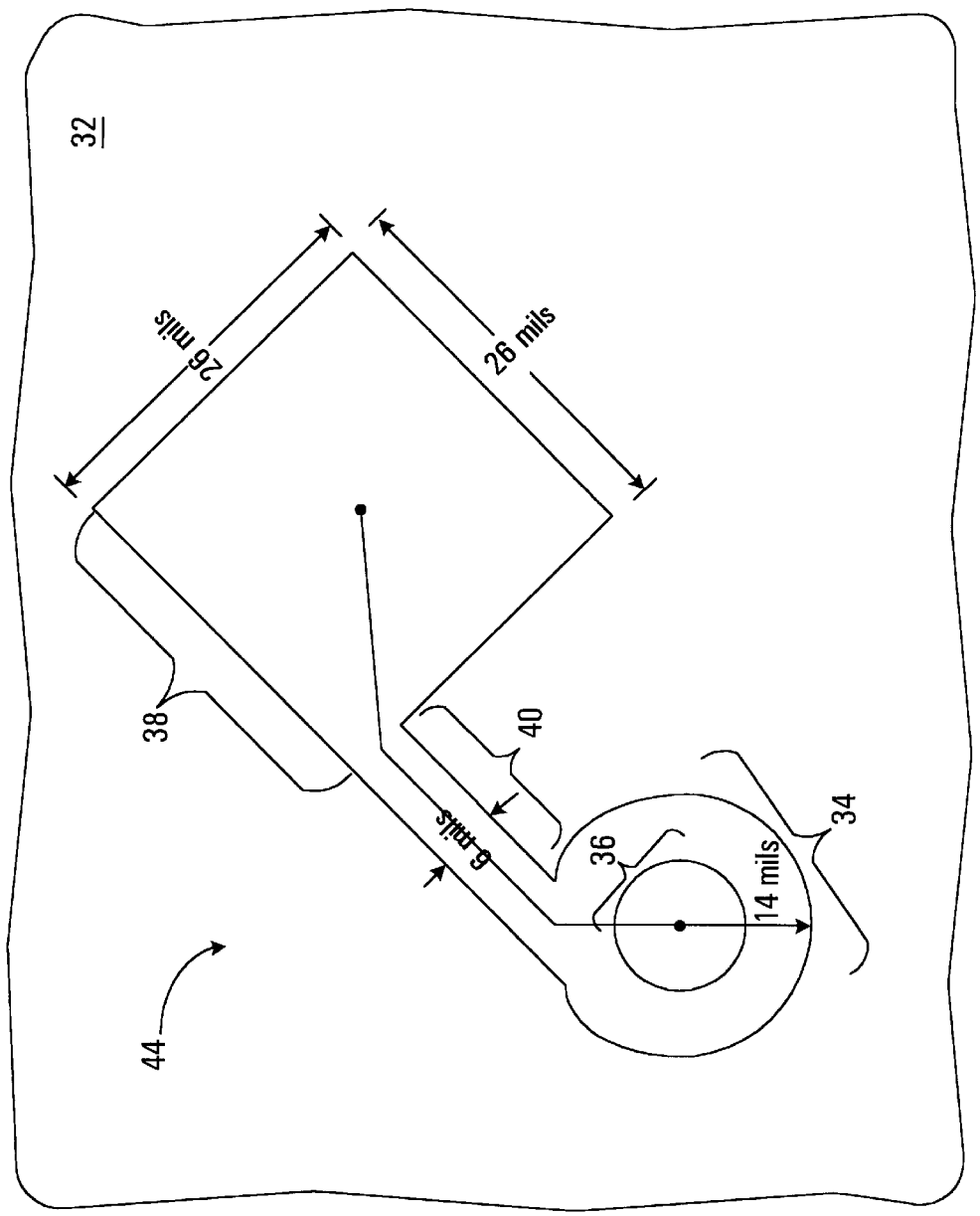
FIG. 4 is a schematic diagram of a flag-shaped BGA land pattern in accordance with the present claimed invention.

With reference now to FIG. 4, a schematic diagram of a flag-shaped embodiment of a BGA land pattern 44 of the present invention is shown. The dimensions of the flag-shaped embodiment 44 of the present invention are also given. Although such dimensions are used in the present embodiment, the present invention is also well suited to varying the dimensions of the components of flag-shaped BGA land pattern 44. As in diamond-shaped embodiment 42 of the FIG. 3, flag-shaped embodiment 44 is oriented such that the center of substantially rectangularly-shaped landing pad 38, a corner of substantially rectangularly-shaped landing pad 38, and the center of via 36 are not collinear. In flag-shaped BGA land pattern 44, conductive connecting region 40 extends substantially tangentially from capture pad 34 to a nearest corner of substantially rectangularly-shaped landing pad 38. More specifically, one end of conductive connecting region 40 is coupled to capture pad 34 while the other end of conductive connecting region 40 is coupled to the nearest corner of substantially rectangularly-shaped landing pad 38. Flag-shaped embodiment 44 is also well suited to varying the degree to which substantially rectangularly-shaped landing pad 38 is rotated with respect to capture pad 34.

With reference still to FIG. 4, in addition to providing all of the advantages associated with the embodiments of FIG. 2 and FIG. 3, present flag-shaped embodiment 44 provides additional benefits. That is, the present embodiment provides improved thermal impedance between landing pad 38 and capture pad 34. In flag-shaped embodiment 44, the distance between landing pad 38 and via 36 is lengthened. The distance between landing pad 38 and via 36 is shown by multi-directional line 46. Flag-shaped embodiment 44 provides a longer multi-directional thermal path 46 as opposed to the straight thermal paths found in the prior art. As a result, flag-shaped BGA land pattern 44 increases thermal impedance between landing pad and the via. Thus, the present embodiment restrict the transfer of heat from substantially rectangularly-shaped landing pad 38 to via 36. The present invention, therefore, requires less time to melt solder present on substantially rectangularly-shaped landing pad 38. Hence, heat which is intended to melt solder on the landing pad does, in fact, melt solder instead of being thermally transferred or escaping into via 36. The present embodiment reduces the chance that solder on a landing pad will remain unmelted after convective heating process steps. Thus, the present embodiment reduces the occurrence of shorts thereby insuring that input and output pads of the packaged integrated circuit are electrically connected to the printed circuit board.

Figure 5:
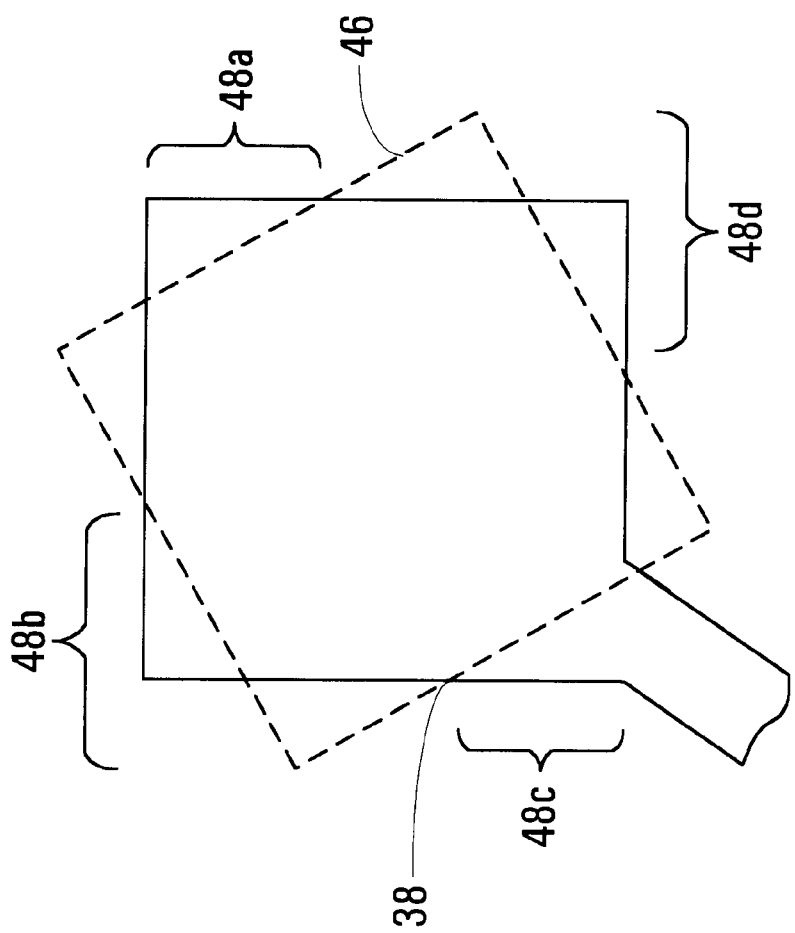
FIG. 5 is a schematic view showing a layer of solder paste applied to a substantially rectangularly-shaped landing pad in accordance with the present claimed invention.

With reference next to FIG. 5, a schematic view of a layer of solder paste, represented by dotted line 46, applied to substantially rectangularly-shaped landing pad 38 is shown. As shown in FIG. 5, layer of solder paste 46 is applied to substantially rectangularly-shaped landing pad 38 such that corners 48a–48d of substantially rectangularly-shaped landing pad 38 are exposed. During convective heating steps, exposed corners 48a–48d become quickly heated and expedite the transfer of heat to the center of substantially rectangularly-shaped landing pad 38. In so doing, the present invention is well suited to expediting the melting of solder on substantially rectangularly-shaped landing pad 38. Hence, the present embodiment reduces the chance that solder on a landing pad will remain unmelted after convective heating process steps. Thus, the present embodiment reduces the occurrence of shorts thereby insuring that input and output pads of the packaged integrated circuit are electrically connected to the printed circuit board.

Figure 6:
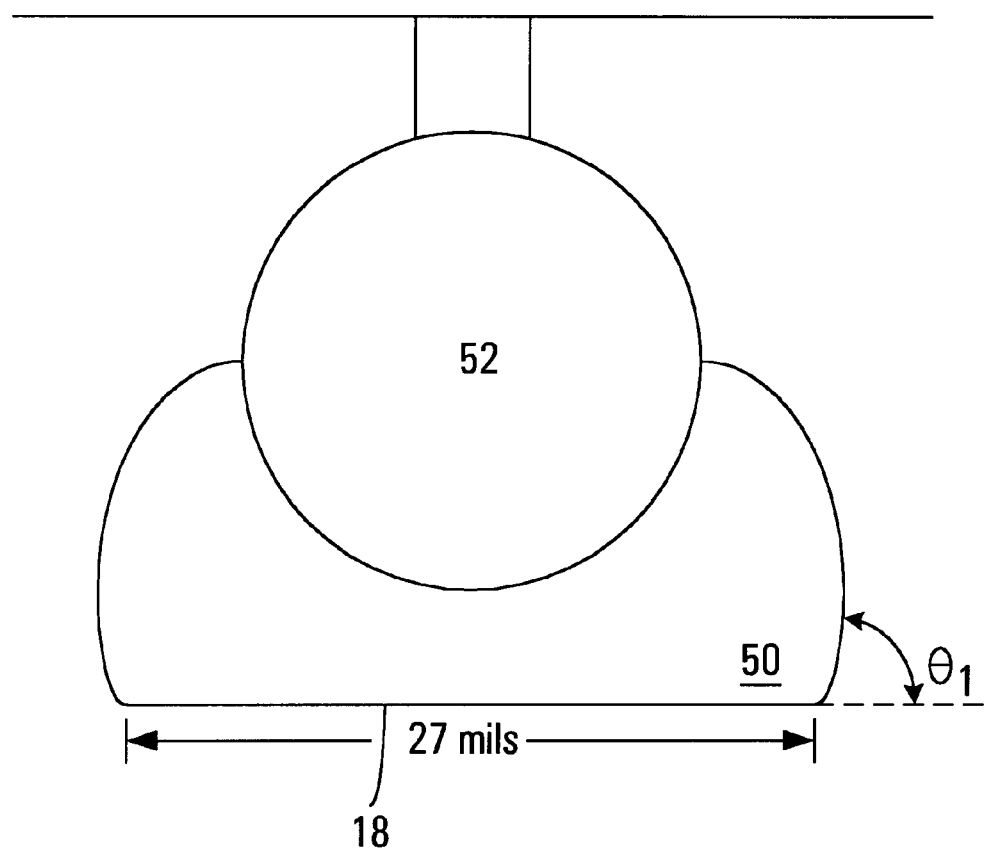
FIG. 6 is a side sectional view of a prior art BGA solder interconnect.

Prior art FIG. 6 is a side sectional view of a prior art BGA solder interconnect. The side sectional view is taken diagonally across prior art landing pad 18 of prior art FIG. 1. Because prior art landing pad 18 is circular, pad 18 has a maximum cross-sectional width of 27 mils. As shown in prior art FIG. 6A, the solder connection 50 between conductive ball 52 and landing pad 18 has a convex shape. Because of its convex shape, solder connection 50 forms an angle $\Theta_1$ with landing pad 18. As shown in prior art FIG. 6A, $\Theta_1$ is less than 90 degrees. Such a small angle tends to place stress on solder connection 50 between conductive ball 52 and landing pad 18. Stress on solder connection 50 can crack or break the connection between conductive ball 52 and landing pad 18 leading to opens.

Figure 7:
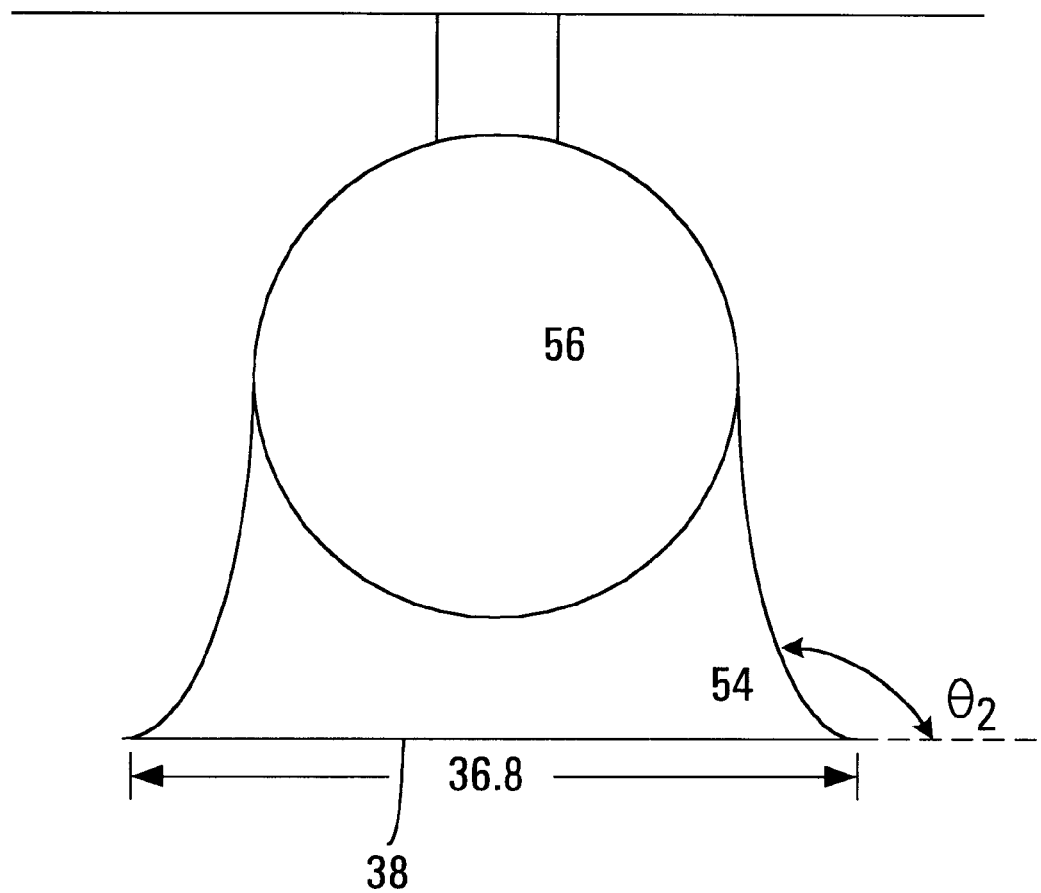
FIG. 7 is a side sectional view of a BGA solder interconnect in accordance with the present claimed invention.

With reference next to FIG. 7, a side sectional view of a BGA solder interconnect formed in accordance with the present claimed invention is shown. The side sectional view is taken diagonally across substantially rectangularly-shaped landing pad 38 of FIGS. 2–5. Because of the shape of substantially rectangularly-shaped landing pad 38, pad 38 has a maximum cross-sectional width of approximately 36.8 mils. Such a length is significantly longer than the maximum length of prior art landing pad 18. As shown in FIG. 7, the solder connection 54 between conductive ball 56 and landing pad 38 has a concave shape. Because of its concave shape, solder connection 54 forms an angle $\Theta_2$ with landing pad 38. As shown in FIG. 7, $\Theta_2$ is greater than 90 degrees. Such a large angle tends to reduce stress on solder connection 54 between conductive ball 56 and landing pad 38. The lower stress reduces the formation of cracks or breaks within solder connection 54. Thus, the present invention reduces the occurrence of opens thereby insuring that conductive balls are electrically connected to respective landing pads.

Figure 8:
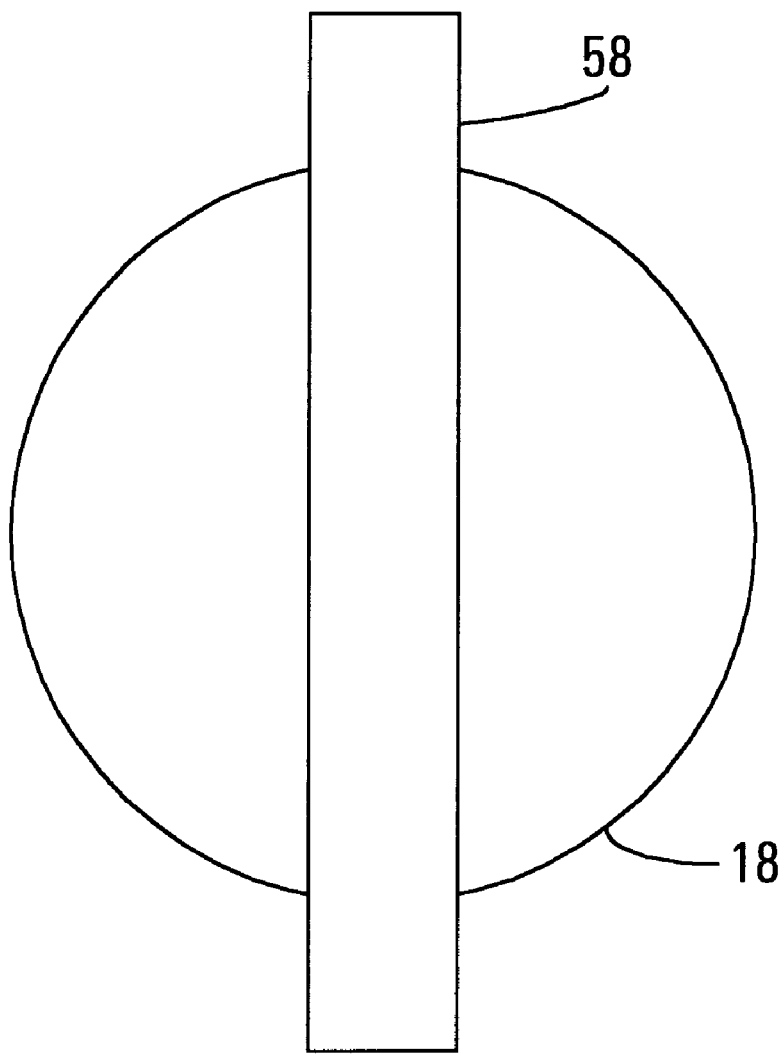
FIG. 8 is a schematic top view of a Prior Art circular landing pad having a C-beam interposer disposed thereon.

The enlarged maximum cross-sectional width provided by the present invention is also beneficial for socketability applications. Prior Art FIG. 8 is a schematic top view of a Prior Art circular landing pad having a C-beam interposer disposed thereon. As shown in Prior Art FIG. 8, a C-beam interposer 58 placed over a prior art landing pad 18 may extend beyond the boundaries of the landing pad 18. When C-beam interposer 58 extends beyond landing pad 18, the ends of interposer 58 can contact solder mask, not shown, surrounding landing pad 18. Because the height or thickness of the solder mask generally extends higher than the surface of landing pad 18, C-beam interposer 58 may actually rest above landing pad 18. Thus, C-beam interposer 58 will not contact landing pad 18.

Figure 9:
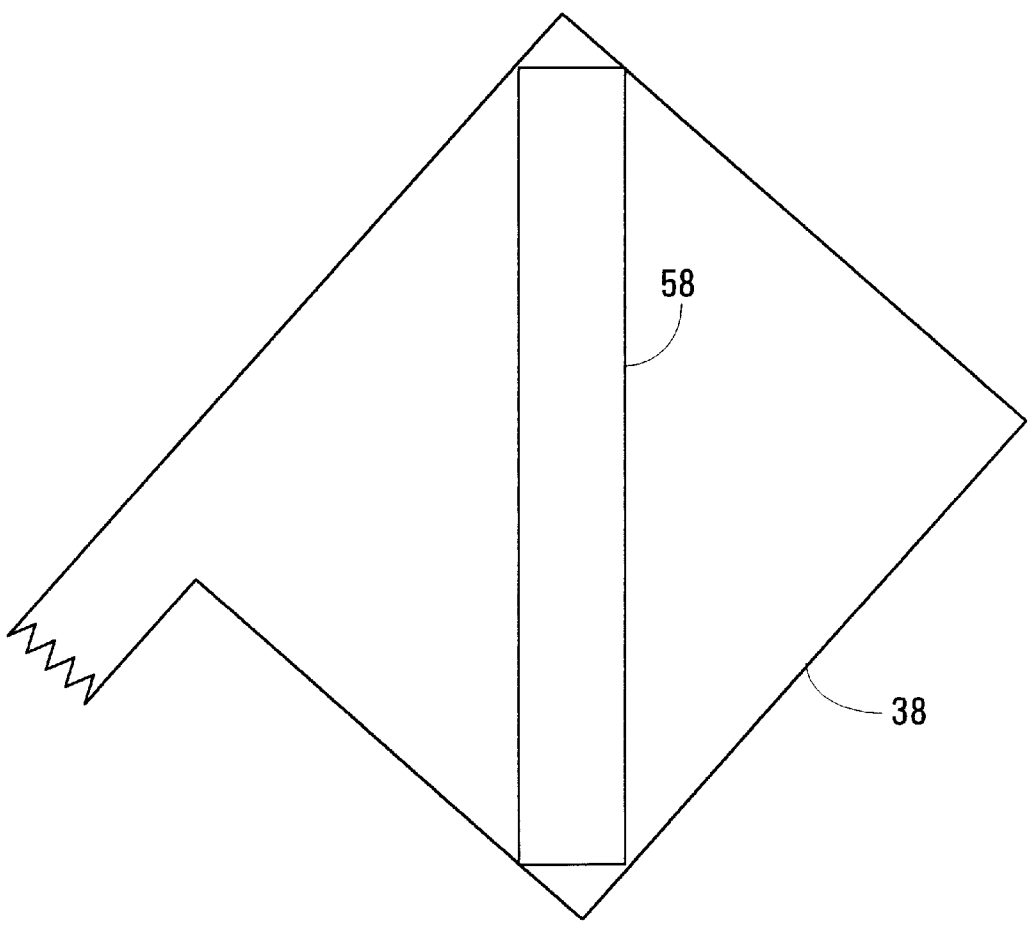
FIG. 9 is a schematic top view of a substantially rectangularly-shaped landing pad having a C-beam interposer disposed in accordance with the present claimed invention.

With reference now to FIG. 9, a schematic top view of a substantially rectangularly-shaped landing pad 38 having a C-beam interposer 58 disposed thereon is shown. In the present invention, the elongated maximum length of substantially rectangularly-shaped landing pad 38 prevents C-beam interposer 58 from extending beyond the boundaries of landing pad 38. Thus, the present invention reduces the frequency of opens between interposers and respective landing pads.

Figure 10:
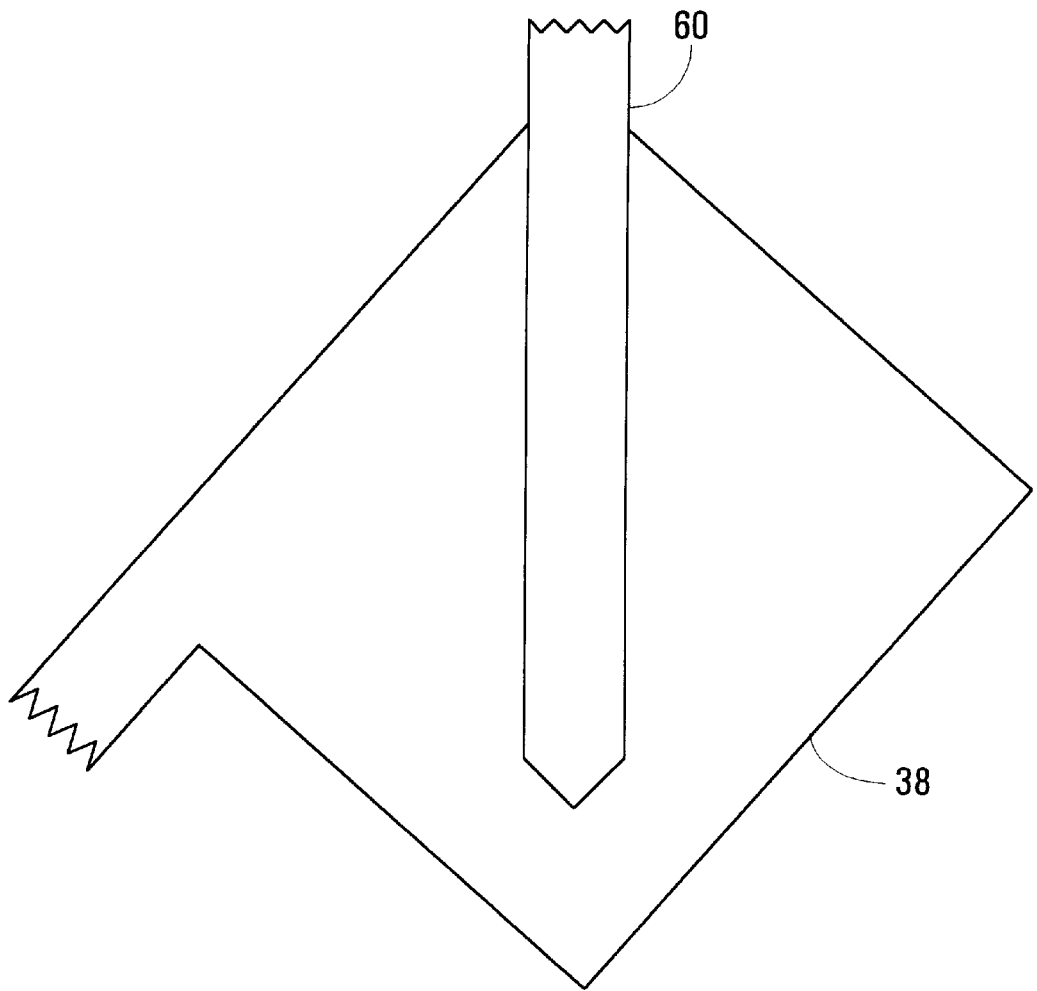
FIG. 10 is a schematic perspective view of a probe contacting a substantially rectangularly-shaped landing pad in accordance with the present claimed invention.

With reference now to FIG. 10, a schematic perspective view of a probe 60 contacting a substantially rectangularly-shaped landing pad is shown. As shown in FIG. 10, probing and testing are also enhanced by the enlarged maximum cross-sectional landing pad width provided by the present invention. Enlarged landing pad 38 of the present invention provides a larger target area for probe 60 during the testing process. Larger landing pad 38 of the present invention is also well suited to wire bonding. Additionally, the substantially rectangular shape of landing pad 38 allows for differentiation between the landing pad, the conductive ball, and the solder connection. Thus, the present invention allows for diagnostic x-ray inspection of the integrity of solder bonds.

Thus, the present invention provides a BGA land pattern which reduces or eliminates defects associated with prior art BGA land patterns; a BGA land pattern which can accommodate fine pitch applications; and a BGA land pattern which does not deleteriously reduce the size of landing pads or capture pads.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A ball grid array (BGA) land pattern comprising:
   a capture pad disposed on a substrate, said capture pad electrically coupled to a via which is formed into said substrate;
   a substantially rectangularly-shaped landing pad disposed on said substrate proximate to said capture pad, said substantially rectangularly-shaped landing pad electrically coupled to said capture pad, said substantially rectangularly-shaped landing pad oriented with respect to said capture pad such that the center of said substantially rectangularly-shaped landing pad, a corner of said substantially rectangularly-shaped landing pad, and the center of said via are not collinear; and
   an electrically conductive connecting region having a first end coupled to said capture pad and a second end coupled to said substantially rectangularly-shaped landing pad, said electrically conductive connecting region extending substantially tangentially from said capture pad to a nearest corner of said substantially rectangularly-shaped landing pad.

2. The BGA land pattern of claim 1 wherein said capture pad peripherally surrounds said via.

3. The BGA land pattern of claim 2 wherein said capture pad is annularly-shaped.

4. The BGA land pattern of claim 3 wherein said annularly-shaped capture pad further comprises:
   an inner diameter disposed at the periphery of said via; and
   an outer diameter of disposed approximately 14 mils from the center of said via.

5. The BGA land pattern of claim 1 wherein each side of said substantially rectangularly-shaped landing pad has a length of approximately 26 mils.

6. The BGA land pattern of claim 1 wherein said substantially rectangularly-shaped landing pad is electrically coupled to said capture pad by an electrically conductive connecting region, said electrically conductive connecting region having a first end coupled to said capture pad and a second end coupled to said substantially rectangularly-shaped landing pad.

7. The BGA land pattern of claim 6 wherein said electrically conductive connecting region has a width of approximately 6 mils.

8. A flag-shaped ball grid array (BGA) land pattern comprising:
   an annularly-shaped capture pad disposed on a substrate, said annularly-shaped capture pad peripherally surrounding and electrically coupled to a via which is formed into said substrate;
   a substantially rectangularly-shaped landing pad disposed on said substrate proximate to said annularly-shaped capture pad, said rectangularly-shaped landing pad oriented with respect to said annularly-shaped capture pad such that the center of said substantially rectangularly-shaped landing pad, a corner of said substantially rectangularly-shaped landing pad, and the center of said via are not collinear; and
   an electrically conductive connecting region having a first end coupled to said annularly-shaped capture pad and a second end coupled to said substantially rectangularly-shaped landing pad such that said substantially rectangularly-shaped landing pad is electrically coupled to said annularly shaped capture pad, said electrically conductive connecting region extending substantially tangentially from said annularly-shaped capture pad to a nearest corner of said substantially rectangularly-shaped landing pad.

9. The flag-shaped BGA land pattern of claim 8 wherein said annularly-shaped capture pad further comprises:
   an inner diameter disposed at the periphery of said via; and
   an outer diameter of disposed approximately 14 mils from the center of said via.

10. The flag-shaped BGA land pattern of claim 8 wherein each side of said substantially rectangularly-shaped landing pad has a length of approximately 26 mils.

11. The flag-shaped BGA land pattern of claim 8 wherein said electrically conductive connecting region has a width of approximately 6 mils.

12. A ball grid array (BGA) land pattern comprising:
    an annularly-shaped capture pad disposed on a substrate, said annularly-shaped capture pad peripherally surrounding and electrically coupled to a via which is formed into said substrate;

a substantially rectangularly-shaped landing pad disposed on said substrate proximate to said annularly-shaped capture pad, said rectangularly-shaped landing pad oriented with respect to said annularly-shaped capture pad such that the center of said substantially rectangularly-shaped landing pad, a corner of said substantially rectangularly-shaped landing pad, and the center of said via are not collinear; and an electrically conductive connecting region having a first end coupled to said annularly-shaped capture pad and a second end coupled to said substantially rectangularly-shaped landing pad such that said substantially rectangularly-shaped landing pad is electrically coupled to said annularly shaped capture pad, said electrically conductive connecting region extending from said annularly-shaped capture pad to an edge of said substantially rectangularly-shaped landing pad.

13. The BGA land pattern of claim 12 wherein said annularly-shaped capture pad further comprises:

an inner diameter disposed at the periphery of said via; and an outer diameter of disposed approximately 14 mils from the center of said via.

14. The BGA land pattern of claim 12 wherein each side of said substantially rectangularly-shaped landing pad has a length of approximately 26 mils.

15. The BGA land pattern of claim 12 wherein said electrically conductive connecting region has a width of approximately 6 mils.

* * * * *